United States Patent
Chen et al.

(10) Patent No.: US 8,519,712 B2
(45) Date of Patent: Aug. 27, 2013

(54) METHOD AND APPARATUS FOR CORRECTING THE UNIFORMITY OF A MAGNETIC FIELD

(75) Inventors: Jin Jun Chen, Shenzhen (CN); Oliver Schreck, Castelldefels-Barcelona (ES)

(73) Assignee: Siemens Aktiengesellschaft, Munich (DE)

( * ) Notice: Subject to any disclaimer, the term of this patent is extended or adjusted under 35 U.S.C. 154(b) by 314 days.

(21) Appl. No.: 12/980,553

(22) Filed: Dec. 29, 2010

(65) Prior Publication Data

US 2011/0163750 A1 Jul. 7, 2011

(30) Foreign Application Priority Data

Dec. 29, 2009 (CN) .......................... 2009 1 0265888

(51) Int. Cl.
*G01R 33/44* (2006.01)
(52) U.S. Cl.
USPC ............................ 324/320; 324/318; 324/319

(58) Field of Classification Search
USPC .................................................. 324/318, 320
See application file for complete search history.

(56) References Cited

U.S. PATENT DOCUMENTS

| 5,661,401 A * | 8/1997 | Ishikawa et al. ............... 324/320 |
| 2007/0126541 A1 * | 6/2007 | Hollis et al. .................. 335/299 |

* cited by examiner

*Primary Examiner* — Melissa Koval
*Assistant Examiner* — Rishi Patel
(74) *Attorney, Agent, or Firm* — Schiff Hardin LLP

(57) ABSTRACT

In a method and apparatus for correcting the uniformity of a magnetic field, an active shim shell is placed in the magnetic field, a magnetic resonance image of the active shim shell obtained, and the placement position of the active shim shell is determined by analyzing the magnetic resonance image. The value of a shim current in the active shim shell is determined so as to meet the uniformity requirements of the magnetic field according to the placement position. The value of the shim current in said active shim shell is set to the determined value of the shim current.

6 Claims, 1 Drawing Sheet

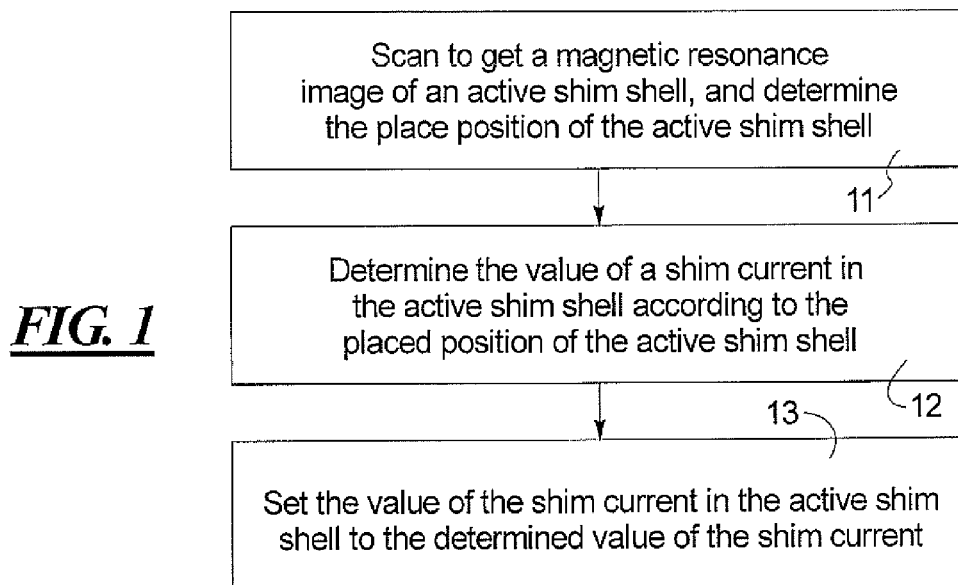
FIG. 1
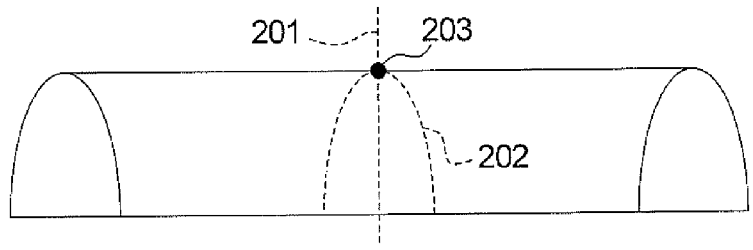
FIG. 2
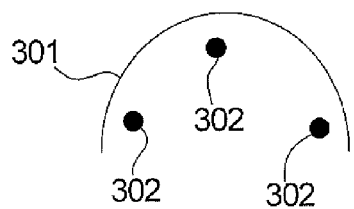
FIG. 3
FIG. 4
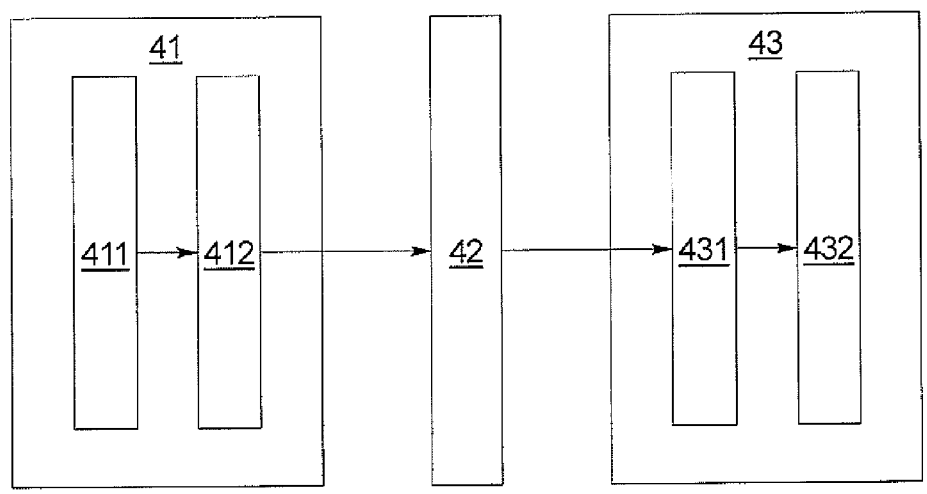

METHOD AND APPARATUS FOR CORRECTING THE UNIFORMITY OF A MAGNETIC FIELD

BACKGROUND OF THE INVENTION

1. Field of the Invention

The present invention relates to the technology of magnetic resonance (MR) and, particularly, to a method and an apparatus for correcting the uniformity of a magnetic field in a magnetic resonance system.

2. Description of the Prior Art

In current magnetic resonance (MR) systems, in order to obtain a magnetic resonance image with relatively good quality, a relatively high uniformity (homogeneity) of the basic magnetic field is required, the basic magnetic field being generated by a basic field magnet. Generally, there are no problems with the uniformity of the magnetic field in the central area of such a magnet (i.e. an annular area), while the uniformity of the magnetic field will decline significantly in the non-central areas. For acquiring MR data from certain tissues and organs, such as the shoulder or chest, etc., since a patient lies flat on the patient bed, which passes through the magnet, these organs are located in the non-central areas of the magnet and, accordingly, the quality of the scanned magnetic resonance images of these tissues and organs is relatively poor, thus influencing the doctor's subsequent analysis and diagnosis. Therefore, in practical applications, it is necessary to adopt certain measures to correct the uniformity of a magnetic field in the non-central areas of a magnet.

If the uniformity of a magnetic field needs to be corrected for all the non-central areas of a magnet, this is generally quite difficult to accomplish and is associated with relatively high costs. Therefore, in practice the uniformity of a magnetic field is generally corrected only for a specified area, for example, if the shoulder-of a patient needs to be scanned, then the uniformity of the magnetic field is corrected only for the area related to the shoulder scanning.

Passive shim shells (PSS) are usually used for correcting the uniformity of a magnetic field in the prior art. The outer casing of such a passive shim shell is made from materials such as plastics, etc., with a number of shims being provided therein. The materials of the shims are generally iron or other ferromagnetic materials. After a passive shim shell has been placed into a magnetic field, the uniformity of the magnetic field is changed by utilizing the characteristics of the shims. A particular implementing method is as follows. Since the spatial distribution of the magnetic field in different areas is known, the placement position of the passive shim shell in the specified area and the number of the shims needed to be placed can be calculated on the basis of this information. An operator then can place the number of shims in the passive shim shell according to the calculated results and place the passive shim shell at a proper position. The passive shim shell can be fixed by a bracket connected to the patient bed.

However, there are certain problems in the aforementioned method in practice because the specific position of the bracket is placed by the operator according to the calculated placement position for the passive shim shell. While there are inevitably certain errors as a result of human operations, it is impossible to ensure that the position of the bracket fully agrees with the calculated placement position of the passive shim shell, thus resulting in the case that the uniformity of the magnetic field is not properly corrected. Furthermore, the size of each shim also influences its performance and if the actual size thereof is slightly different from the theoretical size when the shims are manufactured, then the result of the correction by the passive shim shell to the uniformity of a magnetic field will be subsequently affected. In summary, the currently available method cannot properly achieve the correction of the uniformity of a magnetic field, thus affecting the imaging quality of a magnetic resonance image.

SUMMARY OF THE INVENTION

In view of the above situation, a primary object of the present invention is to provide a method for correcting the uniformity of a magnetic field, which is capable of properly implementing the correction of the uniformity of the magnetic field, thus further improving the imaging quality of the resulting magnetic resonance image.

Another object of the present invention is to provide an apparatus for correcting the uniformity of a magnetic field, which is capable of properly implementing a correction of the uniformity of the magnetic field, thus further improving the imaging quality of the resulting magnetic resonance image.

The above object is achieved in accordance with the invention by a method for correcting the uniformity of a magnetic field, including the steps of placing an active shim shell into the magnetic field, scanning to obtain a magnetic resonance image of the active shim shell and determining the placement position of the active shim shell by analyzing the magnetic resonance image, determining the value of the shim current in the active shim shell so as to meet the uniformity requirements of the magnetic field according to the placement position, and setting the value of the shim current in the active shim shell to the determined value of the shim current.

Preferably, the scanning to obtain the magnetic resonance image of the active shim shell and determining the placement position of said active shim shell by analyzing said magnetic resonance image is accomplished by setting (placing) a contrast medium ball in the active shim shell, and scanning to obtain the magnetic resonance image of the active shim shell. This is followed by determining the offset position of the contrast medium ball relative to the preselected datum point on the magnet by analyzing the magnetic resonance image, and determining the offset position of the datum point on the active shim shell as compared to the datum point on the magnet according to the offset position known of the contrast medium ball relative to the preselected datum point on said active shim shell. This is followed by determining the placement position of the active shim shell on the basis of the known position of the datum point on the magnet and the offset position of the datum point on the active shim shell as compared to the datum point on the magnet.

Preferably, setting the value of the shim current in the active shim shell to the determined value of the shim current is accomplished by calculating the voltage value to be provided in order to make the value of the shim current equal to the determined value of the shim current according to the known resistance of the active shim shell, and setting the output voltage value of the power supply provided to the active shim shell to the determined voltage value.

The aforementioned calculating, determining and analyzing can take place in an automated, computerized manner, such as in a processor. An apparatus for correcting the uniformity of a magnetic field has an analyzing unit, a determining unit and a control unit. The analyzing unit is used for scanning to obtain a magnetic resonance image of an active shim shell placed in the magnetic field and determining the placement position of the active shim shell by analyzing the magnetic resonance image. The determining unit is used for determining the value of a shim current in the active shim shell so as to meet the uniformity requirements of the magnetic field according to the placement position. The control unit is used for setting the value of the shim current in the active shim shell to the determined value of the shim current. Preferably, the active shim shell is an active shim shelf with a contrast medium ball being set therein, and said analyzing unit has a scanning subunit and a determining subunit. The scanning subunit is used for scanning to obtain the magnetic resonance image of said active shim shell. The determining subunit is used for determining the offset position of the contrast medium ball relative to the preselected datum point on the magnet by analyzing the magnetic resonance image, determining the offset position of the datum point on the active shim shell as compared to the datum point on the magnet according to the offset position known of the contrast medium ball relative to the preselected datum point on the active shim shell. The determining subunit also determines the placement position of the active shim shell on the basis of the known position of the datum point on the magnet and the offset position of the datum point on the active shim shell as compared to the datum point on the magnet.

Preferably, the control unit has a calculating subunit and a setting subunit. The calculating subunit is used for calculating the voltage value to be provided in order to make the value of the shim current equal to the determined value of the shim current according to the known resistance of the active shim shell. The setting subunit is used for setting the output voltage value of the power supply provided to the active shim shell to the determined voltage value. The technical solution of the present invention determines the value to which the shim current in the active shim shell should be set so as to meet the uniformity requirements of the magnetic field according to the actual placement position of the active shim shell, and sets the shim current in the active shim shell according to the determined result. Compared with the prior art, the solution of the present invention has no strict requirements on the placement position of the active shim shell, thus avoiding the problem that the result of the correction to the uniformity of a magnetic field is not good enough due to errors caused by human operation or other reasons, and thereby the imaging quality of the magnetic resonance image is improved.

BRIEF DESCRIPTION OF THE DRAWINGS

FIG. 1 is a flow chart of an embodiment of the method for correcting the uniformity of a magnetic field according to the present invention.

FIG. 2 is a schematic diagram of the shape and the position of the central point of an active shim shell in an embodiment of the present invention.

FIG. 3 is a schematic diagram of the position of a contrast medium ball in a method embodiment of the present invention.

FIG. 4 is a schematic diagram of the structure of an apparatus embodiment for correcting the uniformity of a magnetic field according to the present invention.

DESCRIPTION OF THE PREFERRED EMBODIMENTS

Aiming at the problems existing in the prior art, the present invention proposes a completely new method for correcting the uniformity of a magnetic field, i.e. by determining how much the shim current in the active shim shell should be set so as to meet the uniformity requirements of the magnetic field according to the actual placement position of the active shim shell (ASS), and setting the shim current in the active shim shell according to the determined result.

In order to make the technical solution of the present invention more apparent, the solution of the present invention will be further described in detail below by referring to the accompanying drawings and said embodiments.

FIG. 1 is a flow chart of an embodiment of the method for correcting the uniformity of a magnetic field of the present invention. As shown in FIG. 1, it includes the following steps:

Step 11: placing an active shim shell into the magnetic field, scanning to get a magnetic resonance image of the active shim shell, and determining the placement position of the active shim shell by analyzing said magnetic resonance image.

According to the previous description, it is known that in practical applications, the uniformity of a magnetic field is generally only corrected for a specified area, then in this step, the active shim shell can be placed at a certain position in the specified area. Since it is different from the prior art, the solution of the present invention corrects the uniformity of a magnetic field not by the shims but instead by the shim current, and the value of the shim current is determined on the basis of the actual placement position of the active shim shell, thus there is no strict requirement on the placement position of the active shim shell.

Furthermore, in order to facilitate the subsequent and accurate determination of the placement position of the active shim shell, it is necessary to set a contrast medium ball into the active shim shell, and the outer casing of the contrast medium ball is made from a material that cannot perform magnetic resonance imaging, while the media filled therein is a material that is capable of performing the magnetic resonance imaging, such as water or silica gel, etc.

Based on the above mentioned description, the implementation of this step comprises particularly: A. scanning to get the magnetic resonance image of the active shim shell; B. determining the offset position of the contrast medium ball relative to the preselected datum point on the magnet by analyzing said magnetic resonance image, and determining the offset position of the datum point on the active shim shell as compared to the datum point on the magnet according to the offset position known of the contrast medium ball relative to the preselected datum point on the active shim shell; and C. determining the placement position of the active shim shell on the basis of the known position of the datum point on the magnet and the offset position of the datum point on the active shim shell as compared to the datum point on the magnet. Since all of the particular coordinates of the datum point on the magnet including the coordinates in the three directions of X, Y and Z are known, and the offset position of the active shim shell relative to the magnet is known, it would be easy to calculate the coordinates of the active shim shell.

Furthermore, in practical applications, the central point of the magnet can be selected as the datum point on the magnet, and, similarly, the central point of the active shim shell can be selected as the datum point of the active shim shell. FIG. 2 is a schematic diagram of the shape and the central point position of an active shim shell in a method embodiment of the present invention. As shown in FIG. 2, the active shim shell is usually semi-cylindrical in shape, and the intersection 203 of the two dashed lines 201 and 202 illustrated in FIG. 2 is taken as the datum point of the active shim shell, in which the dashed line 201 is the perpendicular bisector of the intersecting line of the central plane of the active shim shell and the tangent plane of the semi-cylinder, the dashed line 202 is the intersecting line of the central plane of the active shim shell and the surface of the semi-cylinder; and the contrast medium ball can be placed anywhere in the semi-cylinder illustrated in FIG. 2.

The particular number of contrast medium balls can be determined according to actual needs, and, generally, in order to give a better reflection of the placement position of the active shim shell, there can be three or more contrast medium balls provided, it being better if these contrast medium balls are not in a straight line. As shown in FIG. 3, FIG. 3 is a schematic diagram of the position of the contrast medium balls 302 in a method embodiment of the present invention. Assuming a total of three contrast medium balls 302 are provided, the placement position of the active shim shell 301 can be determined by combining the conditions of these three contrast medium balls 302.

Step 12: determining the value of the shim current in the active shim shell to meet the uniformity requirements of the magnetic field according to the placement position of the active shim shell.

In this step, how much the shim current in the active shim shell should be set to is determined so as to meet the uniformity requirements of the magnetic field in a specified area according to the known placement position of the active shim shell. How to determine the value of the shim current is well-known in the art, and need not be described herein.

Step 13: setting the value of the shim current in the active shim shell to the determined value of the shim current.

Different from the shims provided within the passive shim shell, what is provided within the active shim shell is a coil and it is possible to know the resistance of the coil. In this step, first the voltage value to be provided to the active shim shell is calculated so as to make the value of the shim current in the active shim shell equal to the value of the shim current determined in step 12; then the output voltage value of the power supply provided to the active shim shell (the power supply voltage provided to the active shim shell) is set to the determined voltage value.

The power supply can be either placed inside the active shim shell or outside the active shim shell, and it is not limited to any particular embodiment.

In addition, in practical applications, other well-known methods in the art can also be adopted to set the value of the shim current, as long as they are capable of achieving the same object, without using the abovementioned method.

On the basis of the above-described method, FIG. 4 is a schematic diagram of the structure of the embodiment of an apparatus for correcting the uniformity of a magnetic field according to the present invention. As shown in FIG. 4, it comprises: an analyzing unit 41, a determining unit 42 and a control unit 43. In this case, the analyzing unit 41 scans to get a magnetic resonance image of an active shim shell placed in the magnetic field and determines the placement position of the active shim shell by analyzing said magnetic resonance image; the determining unit 42 determines the value of the shim current in the active shim shell so as to meet the uniformity requirements of the magnetic field according to the placement position of said active shim shell; and the control unit 43 sets the value of the shim current in the active shim shell to the determined value of the shim current.

In this case, the active shim shell is one with a contrast medium ball provided therein; and the analyzing unit 41 can include a scanning subunit 411 and a determining subunit 412. The scanning subunit 411 scans to obtain the magnetic resonance image of said active shim shell. The determining subunit 412 determines the offset position of the contrast medium ball relative to the preselected datum point on the magnet by analyzing the magnetic resonance image, determines the offset position of the datum point on the active shim shell as compared to the datum point on the magnet according to the offset position known of the contrast medium ball relative to the preselected datum point on the active shim shell, and determines the placement position of the active shim shell on the basis of the position known of the datum point on the magnet and the offset position of the datum point on the active shim shell as compared to the datum point on the magnet.

The control unit 43 can include a calculating subunit 431 and a setting subunit 432.

The calculating subunit 431 calculates the voltage value to be provided so as to make the value of the shim current equal to the determined value of the shim current according to the known resistance of the active shim shell; and the setting subunit 432 sets the output voltage value of the power supply provided to the active shim shell to the determined voltage value.

Reference is made to the corresponding description of the method embodiment illustrated in FIG. 1 for the particular working process of the embodiment of the apparatus illustrated in FIG. 4, and it need not be described redundantly.

In summary, the technical solution of the present invention determines the value to which the shim current in the active shim shell should be set so as to meet the uniformity requirements of the magnetic field according to the actual placement position of the active shim shell, and sets the shim current in the active shim shell according to the determined result. Compared with the prior art, the solution of the present invention has no strict requirements of the placement position of the active shim shell, thus avoiding the problem that the correcting result of the uniformity of a magnetic field is not good enough due to error caused by human operation or other reasons, thus improving the imaging quality of a magnetic resonance image.

In addition, in the prior art, since the placement position of the passive shim shell is fixed, there are limitations in practical applications, for example, if the body of a patient is relatively broad in the horizontal direction, then, when lying on the patient bed, the patient is required to scrunch his/her body or to lie on his/her side in order to avoid certain parts of his/her body touching the bracket, hence changing the placement position of the passive shim shell, which will not only make the patient uncomfortable, but also affect the imaging quality of the magnetic resonance image; while in said solution of the present invention, if there is a patient with a relatively broad body in the horizontal direction, all that needs to be done is to adjust the placement position of the active shim shell, and correspondingly adjust the value of the shim current in the active shim shell according to the needs.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for correcting the uniformity of a magnetic field, comprising:

operating a magnetic resonance data acquisition unit, in which a magnetic field is generated, to obtain a magnetic resonance image of an active shim shell that is physically located at an actual placement position in the magnetic field and determining said actual placement position of said active shim shell by analyzing said magnetic resonance image;

in a processor, automatically determining, dependent on the determined actual placement position, a value that a shim current in said active shim shell must have in order to meet uniformity requirements of the magnetic field; and from said processor, controlling setting the value of the shim current in said active shim shell to the determined value of the shim current.

2. The method for correcting the uniformity of a magnetic field as claimed in claim 1, comprising obtaining the magnetic resonance image and determining the actual placement position of said active shim shell by:

acquiring the magnetic resonance image of the active shim shell with a contrast medium ball being set therein;

determining the offset position of said contrast medium ball relative to the datum point on the magnet by analyzing said magnetic resonance image, and determining the offset position of the datum point on said active shim shell as compared to the datum point on said magnet according to the offset position of said contrast medium ball relative to the datum point on the active shim shell; and determining the placement position of said active shim shell on the basis of the position of the datum point on said magnet and the offset position of the datum point on said active shim shell as compared to the datum point on said magnet.

3. The method for correcting the uniformity of a magnetic field as claimed in claim 1, wherein said step of setting the value of the shim current in said active shim shell to the determined value of the shim current comprises:

calculating the voltage value to be provided in order to make the value of the shim current equal to the determined value of the shim current according to the known resistance of the active shim shell; and setting the power supply voltage provided to the active shim shell to the determined voltage value.

4. An apparatus for correcting the uniformity of a magnetic field, comprising:

a magnetic resonance data acquisition unit, in which a magnetic field is generated, configured to obtain a magnetic resonance image of an active shim shell that is physically located at an actual placement position in the magnetic field;

an analyzing unit configured to determine the actual placement position of said active shim shell by analyzing said magnetic resonance image;

a determining unit configured to determine, dependent on the determined actual placement position, a value that a shim current in said active shim shell must have in order to meet uniformity requirements of the magnetic field; and a control unit configured to set the value of the shim current in said active shim shell to the determined value of the shim current.

5. The apparatus for correcting the uniformity of a magnetic field as claimed in claim 4, wherein said active shim shell comprises a contrast medium ball, and wherein said analyzing unit comprises a scanning subunit and a determining subunit;

said scanning subunit being configured for scanning to obtain the magnetic resonance image of said active shim shell; and said determining subunit being configured to determine the offset position of said contrast medium ball relative to the datum point on the magnet by analyzing said magnetic resonance image, determining the offset position of the datum point on said active shim shell as compared to the datum point on said magnet according to the offset position of said contrast medium ball relative to the datum point on the active shim shell, and to determine the placement position of said active shim shell on the basis of the position of the datum point on said magnet and the offset position of the datum point on said active shim shell as compared to the datum point on said magnet.

6. The apparatus for correcting the uniformity of a magnetic field as claimed in claim 4, wherein said control unit comprises a calculating subunit and a setting subunit;

said calculating subunit being configured to calculate a voltage value to be provided in order to make the value of the shim current equal to the determined value of the shim current according to the known resistance of the active shim shell; and said setting subunit being configured to set a power supply voltage provided to the active shim shell to the determined voltage value.

* * * * *